US011803391B2

(12) United States Patent
Brewer

(10) Patent No.: US 11,803,391 B2
(45) Date of Patent: Oct. 31, 2023

(54) SELF-SCHEDULING THREADS IN A PROGRAMMABLE ATOMIC UNIT

(71) Applicant: Micron Technology, Inc., Boise, ID (US)

(72) Inventor: Tony Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 327 days.

(21) Appl. No.: 17/075,399

(22) Filed: Oct. 20, 2020

(65) Prior Publication Data

US 2022/0237020 A1 Jul. 28, 2022

(51) Int. Cl.
*G06F 9/38* (2018.01)
*G06F 9/48* (2006.01)
*G06F 15/78* (2006.01)
*H01L 25/065* (2023.01)

(52) U.S. Cl.
CPC .......... *G06F 9/3851* (2013.01); *G06F 9/3836* (2013.01); *G06F 9/3867* (2013.01); *G06F 9/48* (2013.01); *G06F 9/4887* (2013.01); *H01L 25/0655* (2013.01); *G06F 15/7825* (2013.01)

(58) Field of Classification Search
None
See application file for complete search history.

(56) References Cited

U.S. PATENT DOCUMENTS

| 8,156,307 | B2 | 4/2012 | Wallach et al. |
|---|---|---|---|
| 8,199,979 | B2 | 6/2012 | Steinberg et al. |
| 8,205,066 | B2 | 6/2012 | Brewer et al. |
| 8,423,745 | B1 | 4/2013 | Brewer |
| 8,561,037 | B2 | 10/2013 | Brewer et al. |
| 9,710,384 | B2 | 7/2017 | Wallach et al. |
| 10,990,391 | B2 | 4/2021 | Brewer |
| 10,990,392 | B2 | 4/2021 | Brewer |
| 2001/0027462 | A1* | 10/2001 | Muramatsu ............. G06F 9/524 718/102 |
| 2007/0234018 | A1* | 10/2007 | Feiste ................... G06F 9/3859 712/229 |

(Continued)

FOREIGN PATENT DOCUMENTS

GB     2483903 A  *  3/2012  ......... G06F 9/30145
KR   20180034440      4/2018

(Continued)

OTHER PUBLICATIONS

"International Application Serial No. PCT US2021 053956, International Search Report dated Jul. 26, 2022", 3 pages.

(Continued)

*Primary Examiner* — Abu Zar Ghaffari
(74) *Attorney, Agent, or Firm* — Schwegman Lundberg & Woessner, P.A.

(57) ABSTRACT

Devices and techniques for threads in a programmable atomic unit to self-schedule are described herein. When it is determined that an instruction will not complete within a threshold prior to insertion into a pipeline of the processor, a thread identifier (ID) can be passed with the instruction. Here, the thread ID corresponds to a thread of the instruction. When a response to completion of the instruction is received that includes the thread ID, the thread is rescheduled using the thread ID in the response.

21 Claims, 6 Drawing Sheets

(56) References Cited

U.S. PATENT DOCUMENTS

| | | |
|---|---|---|
| 2008/0270708 A1 | 10/2008 | Warner et al. |
| 2009/0260013 A1* | 10/2009 | Heil ................ G06F 9/3851 |
| | | 718/103 |
| 2011/0066830 A1 | 3/2011 | Wolfe et al. |
| 2011/0225589 A1* | 9/2011 | Pirog ................ G06F 9/3851 |
| | | 710/305 |
| 2012/0079177 A1 | 3/2012 | Brewer et al. |
| 2013/0212364 A1* | 8/2013 | Fetterman ......... G06F 9/3836 |
| | | 712/E9.033 |
| 2013/0290675 A1* | 10/2013 | Chou ................ G06F 9/50 |
| | | 712/225 |
| 2013/0297910 A1* | 11/2013 | Smolens ........... G06F 9/3851 |
| | | 712/216 |
| 2013/0332711 A1 | 12/2013 | Leidel et al. |
| 2015/0143350 A1 | 5/2015 | Brewer |
| 2015/0206561 A1 | 7/2015 | Brewer et al. |
| 2016/0283249 A1* | 9/2016 | Forsell ............. G06F 9/3893 |
| 2018/0246720 A1* | 8/2018 | Khaleque ......... G06F 9/30021 |
| 2019/0042214 A1 | 2/2019 | Brewer |
| 2019/0171604 A1 | 6/2019 | Brewer |
| 2019/0243700 A1 | 8/2019 | Brewer |
| 2019/0286483 A1 | 9/2019 | Chitnis et al. |
| 2019/0303154 A1 | 10/2019 | Brewer |
| 2019/0303327 A1 | 10/2019 | Brewer |
| 2019/0324928 A1 | 10/2019 | Brewer |
| 2019/0340019 A1 | 11/2019 | Brewer |
| 2019/0340020 A1 | 11/2019 | Brewer |
| 2019/0340023 A1 | 11/2019 | Brewer |
| 2019/0340024 A1 | 11/2019 | Brewer |
| 2019/0340027 A1 | 11/2019 | Brewer |
| 2019/0340035 A1 | 11/2019 | Brewer |
| 2019/0340154 A1 | 11/2019 | Brewer |
| 2019/0340155 A1 | 11/2019 | Brewer |
| 2021/0055964 A1 | 2/2021 | Brewer |
| 2021/0064374 A1 | 3/2021 | Brewer |
| 2021/0064435 A1 | 3/2021 | Brewer |
| 2021/0149600 A1 | 5/2021 | Brewer |
| 2021/0326175 A1* | 10/2021 | Herbert ............. G06F 9/4881 |
| 2021/0389984 A1* | 12/2021 | Pawlowski ........ G06F 9/3851 |
| 2022/0121485 A1* | 4/2022 | Baronne ........... G06F 12/0875 |

FOREIGN PATENT DOCUMENTS

| | | |
|---|---|---|
| WO | 2010051167 | 5/2010 |
| WO | 2013184380 | 12/2013 |
| WO | 2019191740 | 10/2019 |
| WO | 2019191742 | 10/2019 |
| WO | 2019191744 | 10/2019 |
| WO | 2019217287 | 11/2019 |
| WO | 2019217295 | 11/2019 |
| WO | 2019217324 | 11/2019 |
| WO | 2019217326 | 11/2019 |
| WO | 2019217329 | 11/2019 |
| WO | 2019089816 | 4/2020 |
| WO | 2022119636 A2 | 6/2022 |
| WO | 2022119636 A3 | 9/2022 |

OTHER PUBLICATIONS

"International Application Serial No. PCT US2021 053956, Written Opinion dated Jul. 26, 2022", 4 pages.

* cited by examiner

SELF-SCHEDULING THREADS IN A PROGRAMMABLE ATOMIC UNIT

STATEMENT REGARDING GOVERNMENT SUPPORT

This invention was made with U.S. Government support under Agreement No. HR00111890003, awarded by DARPA. The U.S. Government has certain rights in the invention.

BACKGROUND

Chiplets are an emerging technique for integrating various processing functionalities. Generally, a chiplet system is made up of discrete modules (each a "chiplet") that are integrated on an interposer, and in many examples interconnected as desired through one or more established networks, to provide a system with the desired functionality. The interposer and included chiplets can be packaged together to facilitate interconnection with other components of a larger system. Each chiplet can include one or more individual integrated circuits (ICs), or "chips", potentially in combination with discrete circuit components, and commonly coupled to a respective substrate to facilitate attachment to the interposer. Most or all chiplets in a system will be individually configured for communication through the one or more established networks.

The configuration of chiplets as individual modules of a system is distinct from such a system being implemented on single chips that contain distinct device blocks (e.g., intellectual property (IP) blocks) on one substrate (e.g., single die), such as a system-on-a-chip (SoC), or multiple discrete packaged devices integrated on a printed circuit board (PCB). In general, chiplets provide better performance (e.g., lower power consumption, reduced latency, etc.) than discrete packaged devices, and chiplets provide greater production benefits than single die chips. These production benefits can include higher yields or reduced development costs and time.

Chiplet systems can include, for example, one or more application (or processor) chiplets and one or more support chiplets. Here, the distinction between application and support chiplets is simply a reference to the likely design scenarios for the chiplet system. Thus, for example, a synthetic vision chiplet system can include, by way of example only, an application chiplet to produce the synthetic vision output along with support chiplets, such as a memory controller chiplet, a sensor interface chiplet, or a communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those manufactured using different processing technologies or using different feature sizes (or utilizing different contact technologies or spacings). Thus, multiple IC's or IC assemblies, with different physical, electrical, or communication characteristics can be assembled in a modular manner to provide an assembly providing desired functionalities. Chiplet systems can also facilitate adaptation to suit needs of different larger systems into which the chiplet system will be incorporated. In an example, IC's or other assemblies can be optimized for the power, speed, or heat generation for a specific function—as can happen with sensors—can be integrated with other devices more easily than attempting to do so on a single die. Additionally, by reducing the overall size of the die, the yield for chiplets tends to be higher than that of more complex, single die devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
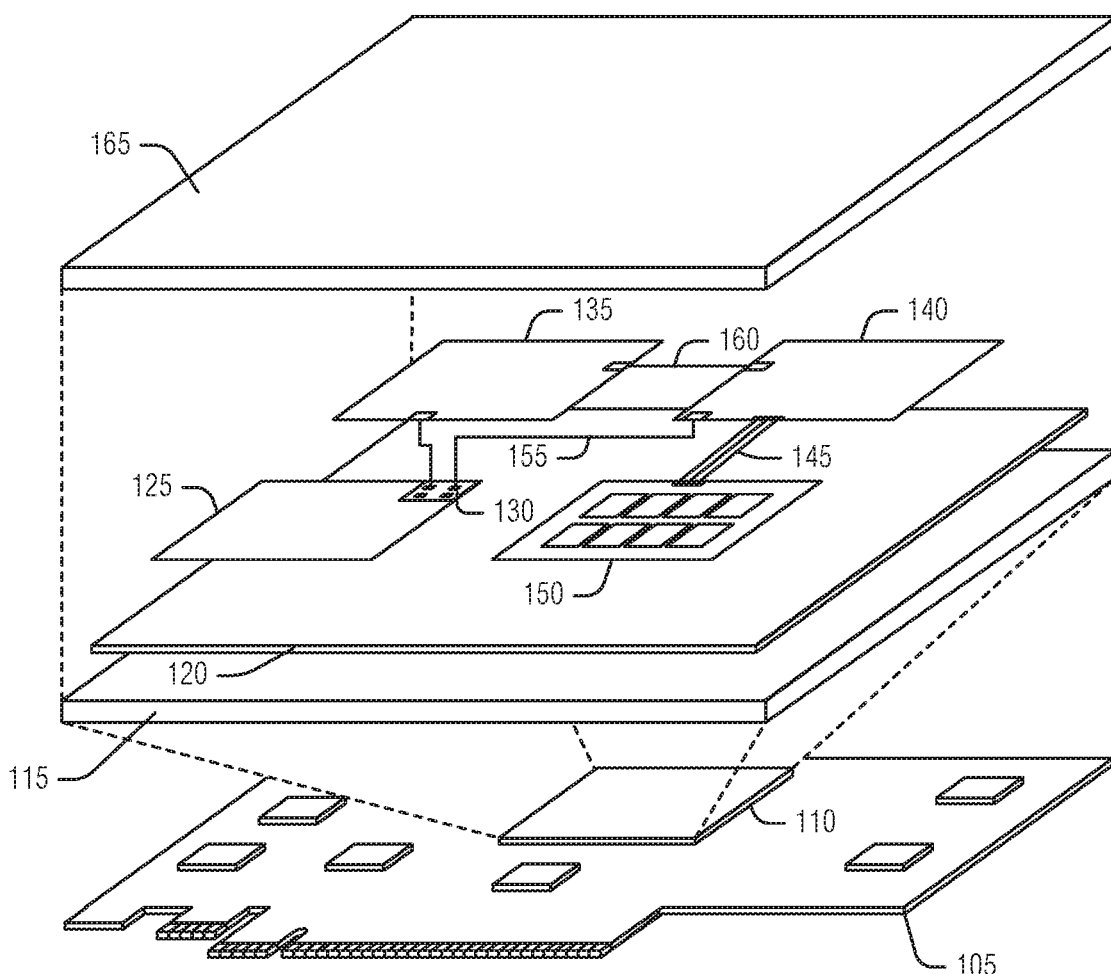
FIGS. 1A and 1B illustrate an example of a chiplet system, according to an embodiment.

FIG. 1, described below, offers an example of a chiplet system and the components operating therein. The illustrated chiplet system includes a memory controller. This memory controller includes a programmable atomic unit (PAU) to execute a custom program, a programmable atomic operator, in response to a memory request for the programmable atomic operator. Additional details about the PAU are described below with respect to FIGS. 2 and 3. The processor of the PAU can be barrel-multithreaded and pipelined. Barrel-multithreaded processors provide several benefits, such as being tolerant of latency to external memory requests while maintaining high instruction execution throughput when many simultaneous threads are executing in a single core.

With different threads executing at different pipeline stages, an issue can arise with regard to the complexity of scheduling threads in the processor. Some resources, such as memory registers, etc., if accessed by different instructions, can cause problems. For example, an instruction in a thread makes a memory request for data to update a register value. This register value can then be considered inconsistent, or wrong, until the data is received from memory and placed into the register. Accordingly, the register should not be used by a subsequent instruction until the memory request completes. Thus, there needs to be a way to track that the register is in an inconsistent state until the memory request is complete.

A traditional way in which resource contention is handled involves using hazards. Generally, a hazard is tracked with, for example, a scoreboard in a processor. When the hazard is manifested (e.g., a memory request is made but not yet complete) the scoreboard indicates the presence of the hazard. The scheduler can then determine whether the resources for a new instruction are hazard free. If the resources are hazard free, the scheduler can begin execution of the instruction in the pipeline. However, if the resources are not hazard free, then the instruction is rescheduled at a later time. While using hazards is effective, it can result in increased complexity of the processor. This increased complexity comes at a cost in die area for the circuitry, a more complex scheduler, etc.

To address the complex scheduling issue noted above, an alternative to hazards can be employed; self-scheduling threads. Here, thread identifiers (IDs) follow instructions. A thread ready-to-run queue holds thread IDs for execution. Only thread IDs for threads in which a next instruction does not have contention on its resources are enqueued in the thread ready-to-run queue. When an instruction is executed, its thread ID is removed from the thread ready-to-run queue, and so the thread will not be run again until the thread ID is enqueued. This enables the instruction handling to determine when the resource contentions are cleared. Thus, in a memory request scenario, for example, the thread ID can be included with the memory request to the external memory. While waiting for the memory response to the memory request, the thread ID is absent from the thread ready-to-run queue, preventing the next instruction in the thread from running. The memory response includes the thread ID. When the data from the memory response is received and written to the appropriate registers, completing the memory request and putting those registers into a consistent state, the thread ID from the memory response can again be enqueue into the thread ready-to-run queue.

Because the operation of the instructions determines whether the thread ID is placed into the thread ready-to-run queue, the threads are self-scheduling. The solution provides high throughput for multiple simultaneously executing PAOs in the presence of latency to memory, for example. Additional details and examples are provided below.

Figure 1B:
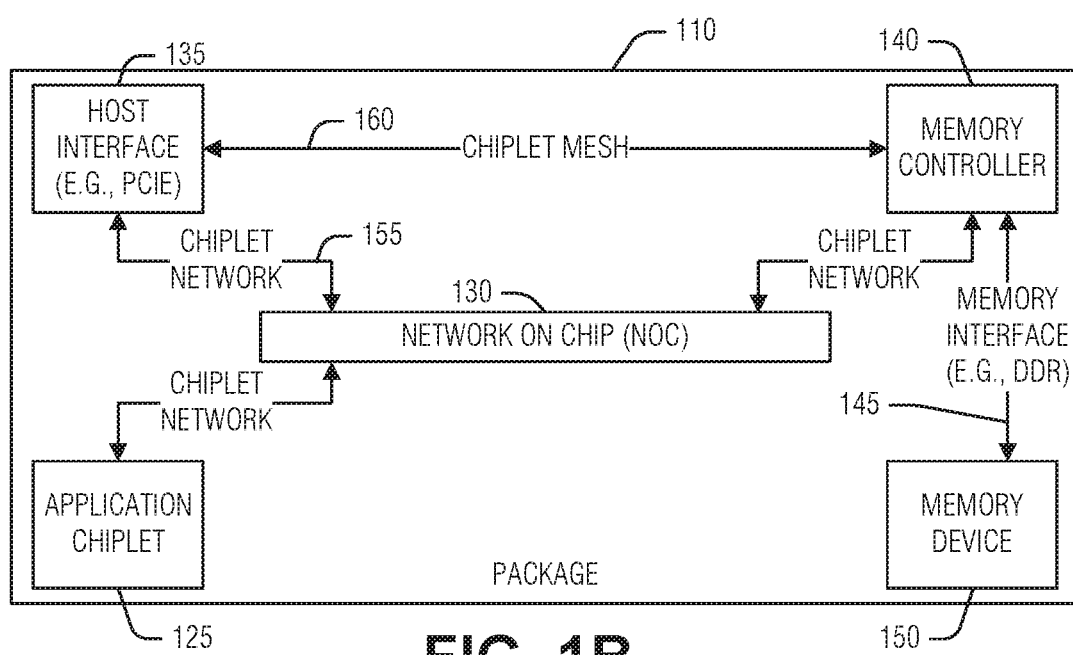

FIGS. 1A and 1B illustrate an example of a chiplet system 110, according to an embodiment. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets, an application chiplet 125, a host interface chiplet 135, a memory controller chiplet 140, and a memory device chiplet 150. Other systems can include many additional chiplets to provide additional functionalities as will be apparent from the following discussion. The package of the chiplet system 110 is illustrated with a lid or cover 165, though other packaging techniques and structures for the chiplet system can be used. FIG. 1B is a block diagram labeling the components in the chiplet system for clarity.

The application chiplet 125 is illustrated as including a network-on-chip (NOC) 130 to support a chiplet network 155 for inter-chiplet communications. In example embodiments NOC 130 can be included on the application chiplet 125. In an example, NOC 130 can be defined in response to selected support chiplets (e.g., chiplets 135, 140, and 150) thus enabling a designer to select an appropriate number or chiplet network connections or switches for the NOC 130. In an example, the NOC 130 can be located on a separate chiplet, or even within the interposer 120. In examples as discussed herein, the NOC 130 implements a chiplet protocol interface (CPI) network.

The CPI is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 155.

CPI can use a variety of different physical layers to transmit packets. The physical layer can include simple conductive connections, or can include drivers to increase the voltage, or otherwise facilitate transmitting the signals over longer distances. An example of one such physical layer can include the Advanced Interface Bus (AIB), which in various examples, can be implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and multiples of 40 bits for DDR mode: (40, 80, 120, . . . ). The AIB channel width includes both transmit and receive signals. The channel can be configured to have a symmetrical number of transmit (TX) and receive (RX) input/outputs (I/Os), or have a non-symmetrical number of transmitters and receivers (e.g., either all transmitters or all receivers) The channel can act as an AIB principal or subordinate depending on which chiplet provides the principal clock. AIB I/O cells support three clocking modes: asynchronous (i.e. non-clocked), SDR, and DDR. In various examples, the non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach, chiplet-to-chiplet interconnects, a parallel interface with clock rates that allow data transfer with minimal latency can be utilized. CPI includes elements to minimize both latency and energy consumption in these ultra-short reach chiplet interconnects.

For flow control, CPI employs a credit-based technique. A recipient, such as the application chiplet 125, provides a sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender allow transmitting of additional information.

Also illustrated is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as one or more industry standard memory interfaces 145 (such as, for example, synchronous memory interfaces, such as DDR5, DDR 6), can also be used to interconnect chiplets. Connection of a chiplet system or individual chiplets to external devices (such as a larger system can be through a desired interface (for example, a PCIE interface). Such as external interface can be implemented, in an example, through a host interface chiplet 135, which in the depicted example, provides a PCIE interface external to chiplet system 110. Such dedicated interfaces 145 are generally employed when a convention or standard in the industry has converged on such an interface. The illustrated example of a Double Data Rate (DDR) interface 145 connecting the memory controller chiplet 140 to a dynamic random access memory (DRAM) memory device 150 is just such an industry convention.

Of the variety of possible support chiplets, the memory controller chiplet 140 is likely present in the chiplet system 110 due to the near omnipresent use of storage for computer processing as well as sophisticated state-of-the-art for memory devices. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operator execution. For some types of memory, maintenance operations tend to be specific to the memory device 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh can be controlled by a host processor or of a memory controller at some times, and at other times controlled by the DRAM memory device, or by logic associated with one or more DRAM devices, such as an interface chip (in an example, a buffer).

Atomic operators are a data manipulation that, for example, can be performed by the memory controller chiplet 140. In other chiplet systems, the atomic operators can be performed by other chiplets. For example, an atomic operator of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the commands success to the application chiplet 125. Atomic operators avoid transmitting the data across the chiplet network 160, resulting in lower latency execution of such commands.

Atomic operators can be classified as built-in atomics or programmable (e.g., custom) atomics. Built-in atomics are a finite set of operations that are immutably implemented in hardware. Programmable atomics are small programs that can execute on a programmable atomic unit (PAU) (e.g., a custom atomic unit (CAU)) of the memory controller chiplet 140. FIG. 1 illustrates an example of a memory controller chiplet that discusses a PAU.

The memory device chiplet 150 can be, or include any combination of, volatile memory devices or non-volatile memories. Examples of volatile memory devices include, but are not limited to, random access memory (RAM)—such as DRAM) synchronous DRAM (SDRAM), graphics double data rate type 6 SDRAM (GDDR6 SDRAM), among others. Examples of non-volatile memory devices include, but are not limited to, negative-and-(NAND)-type flash memory, storage class memory (e.g., phase-change memory or memristor based technologies), ferroelectric RAM (FeRAM), among others. The illustrated example includes the memory device 150 as a chiplet, however, the memory device 150 can reside elsewhere, such as in a different package on the peripheral board 105. For many applications, multiple memory device chiplets can be provided. In an example, these memory device chiplets can each implement one or multiple storage technologies. In an example, a memory chiplet can include, multiple stacked memory die of different technologies, for example one or more static random access memory (SRAM) devices stacked or otherwise in communication with one or more dynamic random access memory (DRAM) devices. Memory controller 140 can also serve to coordinate operations between multiple memory chiplets in chiplet system 110; for example, to utilize one or more memory chiplets in one or more levels of cache storage, and to use one or more additional memory chiplets as main memory. Chiplet system 110 can also include multiple memory controllers 140, as can be used to provide memory control functionality for separate processors, sensors, networks, etc. A chiplet architecture, such as chiplet system 110 offers advantages in allowing adaptation to different memory storage technologies; and different memory interfaces, through updated chiplet configurations, without requiring redesign of the remainder of the system structure.

Figure 2:
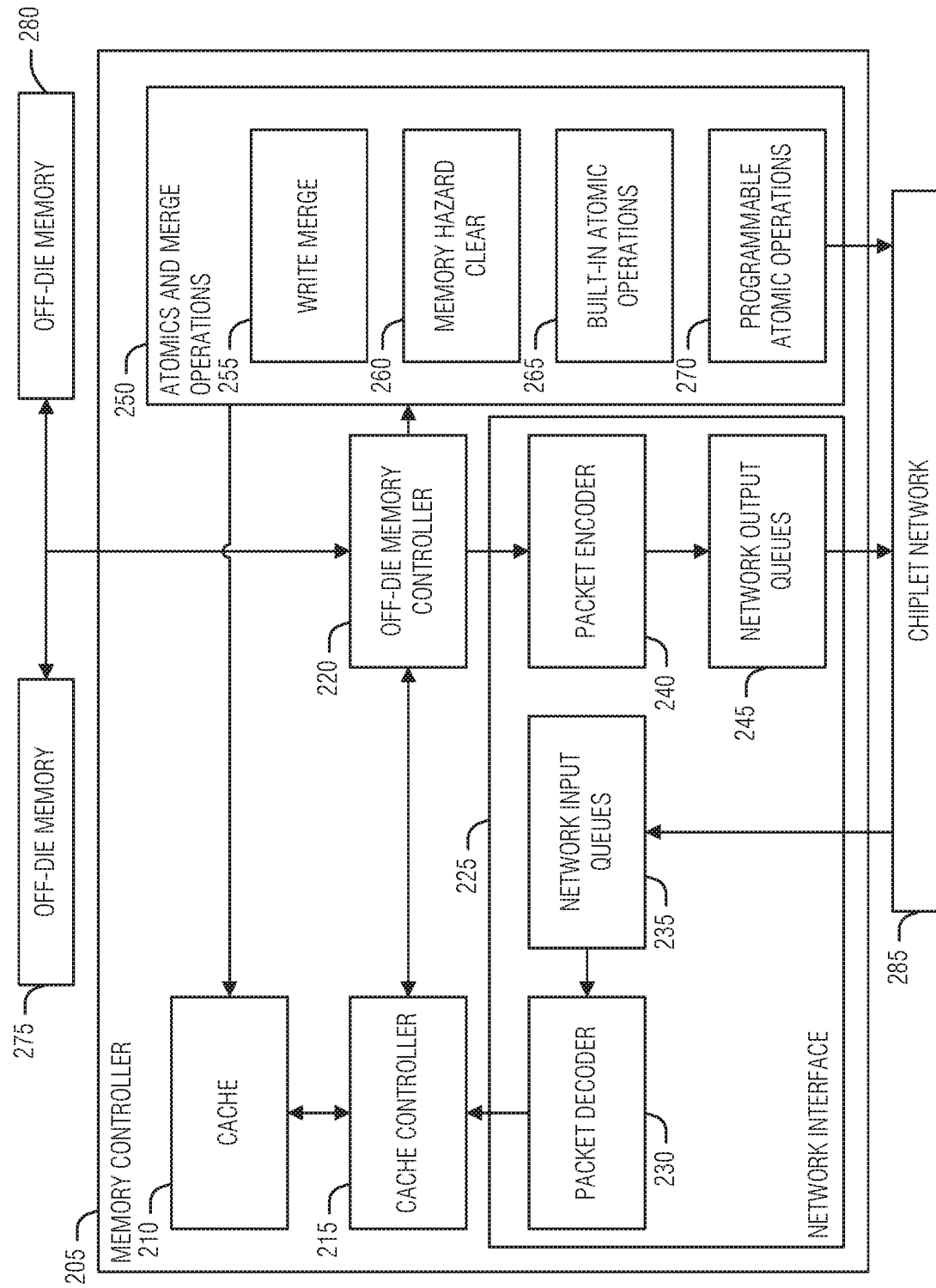
FIG. 2 illustrates components of an example of a memory controller chiplet, according to an embodiment.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 285 and communicate with other chiplets), and a set of atomic and merge units 250. Members of this set can include, for example, a write merge unit 255, a memory hazard unit 260, built-in atomic unit 265, or a PAU 270. The various components are illustrated logically, and not as they necessarily would be implemented. For example, the built-in atomic unit 265 likely comprises different devices along a path to the off-die memory. For example, the built-in atomic unit 265 could be in an interface device/buffer on a memory chiplet, as discussed above. In contrast, the programmable atomic unit 270 could be implemented in a separate processor on the memory controller chiplet 205 (but in various examples can be implemented in other locations, for example on a memory chiplet).

The off-die memory controller 220 is directly coupled to the off-die memory 275 (e.g., via a bus or other communication connection) to provide write operations and read operations to and from the one or more off-die memory, such as off-die memory 275 and off-die memory 280. In the depicted example, the off-die memory controller 220 is also coupled for output to the atomic and merge unit 250, and for input to the cache controller 215 (e.g., a memory side cache controller).

In the example configuration, cache controller 215 is directly coupled to the cache 210, and can be coupled to the network communication interface 225 for input (such as incoming read or write requests), and coupled for output to the off-die memory controller 220.

The network communication interface 225 includes a packet decoder 230, network input queues 235, a packet encoder 240, and network output queues 245 to support a packet-based chiplet network 285, such as CPI. The chiplet network 285 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 285 can be implemented as a collection of crossbar switches having a folded Clos configuration, or a mesh network providing for additional connections, depending upon the configuration.

In various examples, the chiplet network 285 can be part of an asynchronous switching fabric. Here, a data packet can be routed along any of various paths, such that the arrival of any selected data packet at an addressed destination can occur at any of multiple different times, depending upon the routing. Additionally, chiplet network 285 can be implemented at least in part as a synchronous communication network, such as a synchronous mesh communication network. Both configurations of communication networks are contemplated for use for examples in accordance with the present disclosure.

The memory controller chiplet 205 can receive a packet having, for example, a source address, a read request, and a physical address. In response, the off-die memory controller 220 or the cache controller 215 will read the data from the specified physical address (which can be in the off-die memory 275 or in the cache 210), and assemble a response packet to the source address containing the requested data. Similarly, the memory controller chiplet 205 can receive a packet having a source address, a write request, and a physical address. In response, the memory controller chiplet 205 will write the data to the specified physical address (which can be in the cache 210 or in the off-die memories 275 or 280), and assemble a response packet to the source address containing an acknowledgement that the data was stored to a memory.

Thus, the memory controller chiplet 205 can receive read and write requests via the chiplet network 285 and process the requests using the cache controller 215 interfacing with the cache 210, if possible. If the request cannot be handled by the cache controller 215, the off-die memory controller 220 handles the request by communication with the off-die memories 275 or 280, the atomic and merge unit 250, or both. As noted above, one or more levels of cache can also be implemented in off-die memories 275 or 280; and in some such examples can be accessed directly by cache controller 215. Data read by the off-die memory controller 220 can be cached in the cache 210 by the cache controller 215 for later use.

The atomic and merge unit 250 are coupled to receive (as input) the output of the off-die memory controller 220, and to provide output to the cache 210, the network communication interface 225, or directly to the chiplet network 285. The memory hazard unit 260, write merge unit 255 and the built-in (e.g., predetermined) atomic unit 265 can each be implemented as state machines with other combinational logic circuitry (such as adders, shifters, comparators, AND gates, OR gates, XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 285.

When the request data is for a built-in atomic operator, the built-in atomic unit 265 receives the request and reads data, either from the write merge unit 255 or directly from the off-die memory controller 220. The atomic operator is performed, and using the write merge unit 255, the resulting data is written to the cache 210, or provided to the network communication interface 225 to encode and prepare a response or return data packet for transmission on the chiplet network 285.

The built-in atomic unit 265 handles predefined atomic operators such as fetch-and-increment or compare-and-swap. In an example, these operations perform a simple read-modify-write operation to a single memory location of 32-bytes or less in size. Atomic memory operations are initiated from a request packet transmitted over the chiplet network 285. The request packet has a physical address, atomic operator type, operand size, and optionally up to 32-bytes of data. The atomic operator performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operators can also involve requests for a "standard" atomic operator on the requested data, such as comparatively simple, single cycle, integer atomics—such as fetch-and-increment or compare-and-swap—which will occur with the same throughput as a regular memory read or write operation not involving an atomic operator. For these operations, the cache controller 215 can generally reserve a cache line in the cache 210 by setting a hazard bit (in hardware), so that the cache line cannot be read by another process while it is in transition. The data is obtained from either the off-die memory 275 or the cache 210, and is provided to the built-in atomic unit 265 to perform the requested atomic operator. Following the atomic operator, in addition to providing the resulting data to the packet encoder 240 to encode outgoing data packets for transmission on the chiplet network 285, the built-in atomic unit 265 provides the resulting data to the write merge unit 255, which will also write the resulting data to the cache 210. Following the writing of the resulting data to the cache 210, any corresponding hazard bit which was set will be cleared by the memory hazard unit 260.

The PAU 270 enables high performance (high throughput and low latency) for programmable atomic operators (also referred to as "custom atomic transactions" or "custom atomic operators"), comparable to the performance of built-in atomic operators. Rather than executing multiple memory accesses, in response to an atomic operator request designating a programmable atomic operator and a memory address, circuitry in the memory controller chiplet 205 transfers the atomic operator request to PAU 270 and sets a hazard bit stored in a memory hazard register corresponding to the memory address of the memory line used in the atomic operator, to ensure that no other operation (read, write, or atomic) is performed on that memory line, which hazard bit is then cleared upon completion of the atomic operator. Additional, direct data paths provided for the PAU 270 executing the programmable atomic operators allow for additional write operations without any limitations imposed by the bandwidth of the communication networks and without increasing any congestion of the communication networks.

The PAU 270 includes a multi-threaded processor, for example, such as a RISC-V ISA based multi-threaded processor, having one or more processor cores, and further having an extended instruction set for executing programmable atomic operators. When provided with the extended instruction set for executing programmable atomic operators, the PAU 270 can be embodied as one or more hybrid threading processors. In some example embodiments, the PAU 270 provides barrel-style, round-robin instantaneous thread switching to maintain a high instruction-per-clock rate.

Programmable atomic operators can be performed by the PAU 270 involving requests for a programmable atomic operator on the requested data. A user can prepare programming code to provide such programmable atomic operators. For example, the programmable atomic operators can be comparatively simple, multi-cycle operations such as floating-point addition, or comparatively complex, multi-instruction operations such as a Bloom filter insert. The programmable atomic operators can be the same as or different than the predetermined atomic operators, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the cache 210 or the off-die memories 275 or 280, and is provided to the PAU 270 to perform the requested programmable atomic operator. Following the atomic operator, the PAU 270 will provide the resulting data to the network communication interface 225 to directly encode outgoing data packets having the resulting data for transmission on the chiplet network 285. In addition, the PAU 270 will provide the resulting data to the cache controller 215, which will also write the resulting data to the cache 210. Following the writing of the resulting data to the cache 210, any corresponding hazard bit which was set will be cleared by the cache control circuit 215.

In selected examples, the approach taken for programmable atomic operators is to provide multiple, generic, custom atomic request types that can be sent through the chiplet network 285 to the memory controller chiplet 205 from an originating source such as a processor or other system component. The cache controllers 215 or off-die memory controller 220 identify the request as a custom atomic and forward the request to the PAU 270. In a representative embodiment, the PAU 270: (1) is a programmable processing element capable of efficiently performing a user defined atomic operator; (2) can perform load and stores to memory, arithmetic and logical operations and control flow decisions; and (3) leverages the RISC-V ISA with a set of new, specialized instructions to facilitate interacting with such controllers 215, 220 to atomically perform the user-defined operation. In desirable examples, the RISC-V ISA contains a full set of instructions that support high level language operators and data types. The PAU 270 can leverage the RISC-V ISA, but will commonly support a more limited set of instructions and limited register file size to reduce the die size of the unit when included within the memory controller chiplet 205.

As mentioned above, prior to the writing of the read data to the cache 210, the set hazard bit for the reserved cache line is to be cleared, by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will also release a pending read or write request involving the designated (or reserved) cache line, providing the pending read or write request to an inbound request multiplexer for selection and processing.

Figure 3:
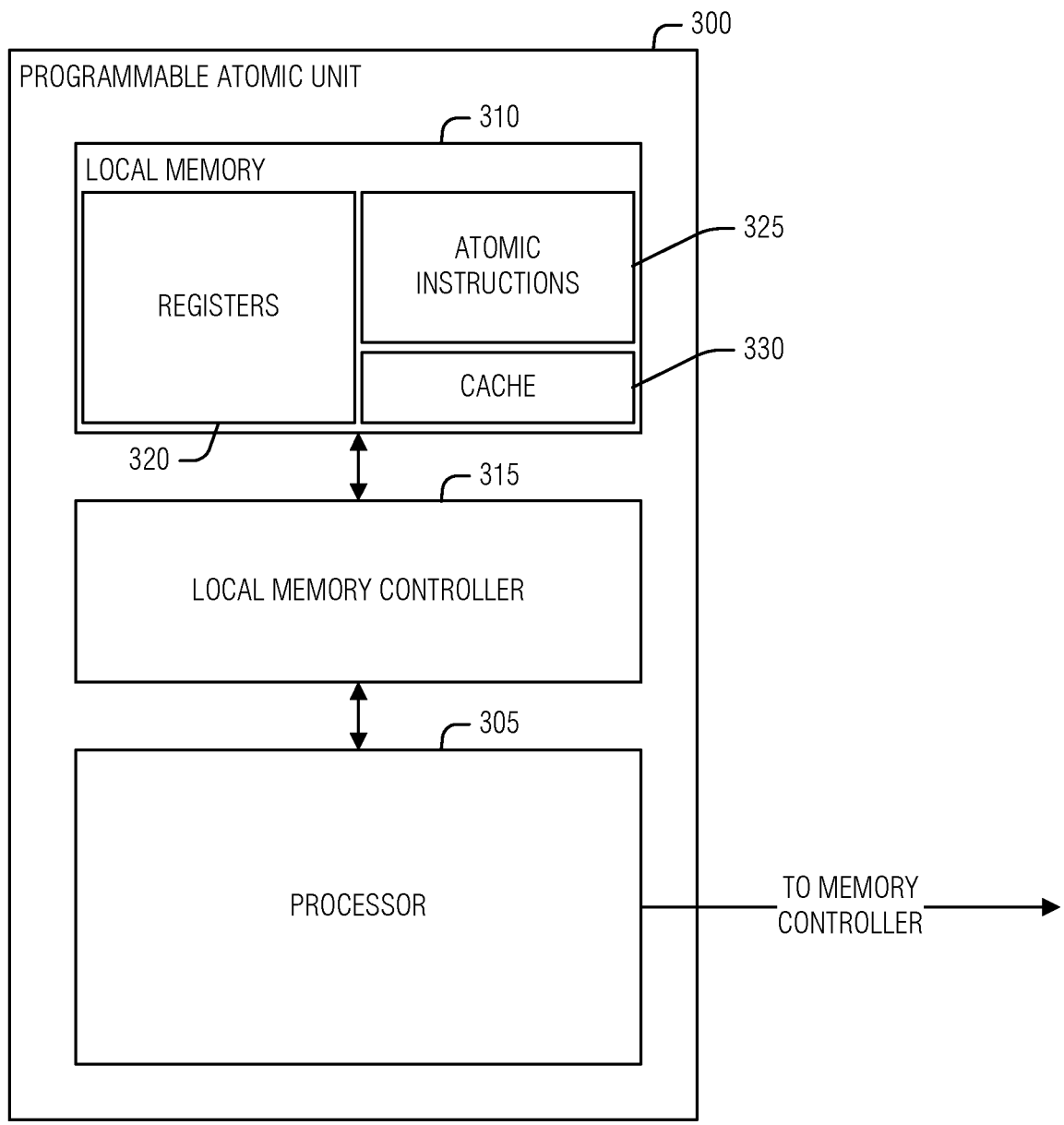
FIG. 3 illustrates a high-level relationship between components of a memory controller chiplet, according to an embodiment.

FIG. 3 illustrates components in an example of a programmable atomic unit 300 (PAU), such as those noted above with respect to FIG. 1 (e.g., in the memory controller 140) and FIG. 2 (e.g., PAU 270), according to an embodiment. As illustrated, the PAU 300 includes a processor 305, local memory 310 (e.g., one or more SRAM devices), and a controller 315 for the local memory 310.

In an example, the processor 305 is a pipelined such that multiple stages of different instructions are executed together per clock cycle. The processor 305 is also a barrel-multithreaded processor, with circuitry to switch between different register files (e.g., sets of registers containing current processing state) upon each clock cycle of the processor 305. This enables efficient context switching between currently executing threads. In an example, the processor 305 supports eight threads, resulting in eight register files. In an example, some or all of the register files are not integrated into the processor 305, but rather reside in the local memory 310 (registers 320). This reduces circuit complexity in the processor 305 by eliminating the traditional flip-flops used for these registers 320.

The local memory 310 can also house a cache 330 and instructions 325 for atomic operators. The atomic instructions 325 comprise sets of instructions to support the various application-loaded atomic operators. When an atomic operator is requested—by the application chiplet 125, for example—a set of instructions corresponding to the atomic operator are executed by the processor 305. In an example, the atomic instructions 325 are partitioned to establish the sets of instructions. In this example, the specific programmable atomic operator being requested by a requesting process can identify the programmable atomic operator by the partition number. The partition number can be established when the programmable atomic operator is registered with (e.g., loaded onto) the PAU 300. Additional metadata for the programmable atomic instructions 325 can also be stored in the local memory 310, such as the partition tables.

The processor 305 can implement a thread self-scheduling technique to address intra-thread resource contention without resorting to explicitly tracking hazards (e.g., using a scoreboard). To this end, the processor 305 is configured to determine that an instruction will not complete within a threshold prior to inserting the instruction into the pipeline. As discussed below, this determination ascertains whether the processor will track the thread ID (e.g., see the fixed-completion-time instructions discussed below with respect to FIG. 4) or whether the thread will self-schedule (e.g., see the variable completion-time instructions with respect to FIG. 4).

In an example, the threshold used by the processor 305 is based on a number of pipeline stages. Generally, if the instruction will complete within the maximum number of pipeline stages, then the instruction will not be self-scheduled. In an example, the threshold is whether or not the instruction relies upon an external entity. Such external entity request can result in varying latencies outside of the processor's control resulting in variable response times suitable to self-scheduling. In an example, the external entity is a memory. In an example, the external entity is a coprocessor.

Once it is determined that the instruction will self-schedule, the processor 305 is configured to pass the thread ID for the instruction along with the instruction. Passing the thread ID entails including the thread ID in data as it moves to an external entity, such as memory in a memory request scenario. The purpose of passing the thread ID is to receive the thread ID in any response indication completion of the instruction. Thus, the processor 305 is configured to receive a response to completion of the instruction, the response including the thread ID.

Once the response is received, completing any additional actions, such as writing memory response data to the appropriate registers, can be handled by the processor 305. The received thread ID can be placed back into a thread ready-to-run queue, awaiting to be dequeued by the scheduler to complete the register writeback. Thus, the processor 305 is configured to reschedule the instruction in response to receiving the response with the thread ID. In an example, rescheduling the thread in response to receiving the response includes placing the thread ID from the response in a thread ready-to-run queue. In an example, rescheduling the thread includes scheduling a next thread by removing a thread ID from a head of the thread ready-to-run queue.

Generally, the thread ready-to-run queue can have contention on insertions on any given clock cycle of the processor 305. Because instructions that provoke a self-scheduling result generally involve the processor 305 being unable to determine when the response will arrive, the processor 305 can include a buffer (e.g., the buffer 465 illustrated in FIG. 4) to hold the responses until the thread ID can be placed into the thread ready-to-run queue. Thus, in an example, receiving the response to the completion of the instruction includes buffering the thread ID until it is clear to reschedule the thread. In an example, it is clear to reschedule the thread when there are no pipeline threads ready to be rescheduled, a pipelined thread being a thread with an instruction that would complete with the threshold. This example illustrates that thread IDs provided by the pipelined thread ID component 440 illustrated in FIG. 4, or threads for other fixed-completion-time instructions, are given priority over the variable-completion-time instruction responses for insertion into the thread ready-to-run queue.

Removing thread IDs from the scheduler (e.g., thread ready-to-run queue) and having the thread ID tag, or follow, responses to long-running instructions, each of these responses self-schedules the thread again when it is clear for the thread to proceed. This eliminates the complexities of tracking intra-thread conflicts without resorting to complex schedulers or record keeping by the processor 305.

Atomic operators manipulate the cache 330, which is generally synchronized (e.g., flushed) when a thread for an atomic operator completes. Thus, aside from initial loading from the external memory, such as the off-die memory 275 or 280, latency is reduced for most memory operations during execution of a programmable atomic operator thread.

Figure 4:
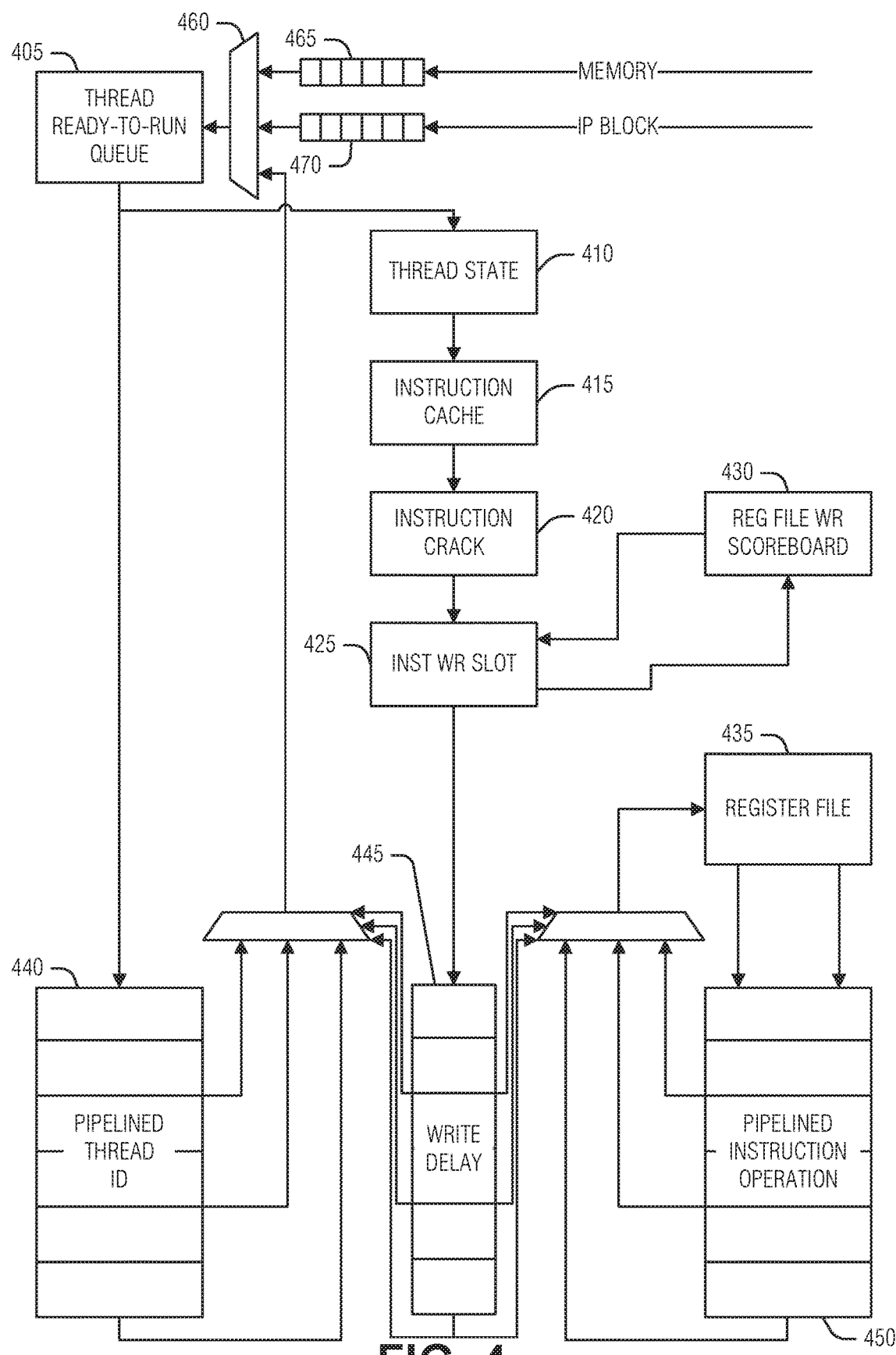
FIG. 4 illustrates a logical communication through components of a programmable atomic unit processor, according to an embodiment.

FIG. 4 illustrates a logical communication through components of a programmable atomic unit processor, according to an embodiment. As illustrated, a thread ID is taken from the ready-to-run queue. When a next instruction will be processed, the thread ID is taken from the thread ready-to-run queue 405 and the state of that thread is obtained (thread state component) 410. The next instruction for that thread is cached (instruction cache component 415). Next, the instruction is decoded (e.g., cracked) into constituent parts, such as the operands, instruction type, etc. at the instruction crack component 420.

The instruction writeback slot component 425 examines the instruction and determines at what stage in the pipeline 150 the instruction would complete. In this context, instruction completion means a point when the instruction will attempt to write back to the register file 435. For example, a move instruction (e.g., moving data from one register to another) can be quite quick and complete at stage two of the pipeline 450, or in two clock cycles from entering the pipeline. In contrast, a double precision addition instruction can complete at stage four of the pipeline 450 or take four clock cycles. These types of instructions have a known, or fixed, completion within a stage of the pipeline 450, and thus are here called fixed-completion-time instructions. Other instructions, such as requests to off-die memory or to a component outside of the processor (e.g., a co-processor, cryptography component, or other IP block) can have a completion time beyond the pipeline stages, which can also be variable, and thus are called variable-completion-time instructions.

If the instruction writeback slot 425 determines that the instruction is a variable-completion-time instruction, a form of thread self-scheduling can be used. Here, the processor will hand over the timing of the re-scheduling of the thread, to a degree, to the external or long-running component. To accomplish this, the thread ID travels with the instruction. Thus, for example, as a memory request instruction enters the pipeline 450 to process the memory request, the thread ID for the instruction accompanies the memory request. At this point, the thread ID is no longer in the thread-ready-to-run queue 405, nor in any other illustrated structure. Accordingly, the thread will not be rescheduled. However, when the memory request is complete, the response from memory is received by the processor and stored in buffer 465. A separate buffer 470 can be used for another IP block (e.g., coprocessor) response, of the buffer 465 can be used for all variable-completion-time instruction responses. The multiplexer 460 determines when the threads corresponding to the responses in the buffers 465 or 470 will be placed back into the thread ready-to-run queue for rescheduling.

If the instruction is a fixed-completion-time instruction, the instruction writeback slot component 425 checks the register writeback scoreboard 430 to determine whether any other register writeback could be attempted at the same clock cycle as the current instruction. For example, if, two clock cycles ago, an instruction can writeback in four clock cycles, and the current instruction can writeback in two clock cycles, then both instructions will be able to writeback on the same clock cycle. This potential collision is tracked in the register writeback scoreboard 430. The register writeback scoreboard 430 tracks which clock cycles do not have a potential writeback. Thus, when the 4-cycle instruction was processed by the instruction writeback slot component 425, the fourth clock cycle was marked to indicate a writeback by the 4-cycle component. Then, two cycles later, when the 2-cycle instruction is processed, the clock cycle when the 2-cycle instruction could finish is marked by the 4-cycle instruction, indicating a register writeback conflict.

When the instruction writeback slot component 425 detects a register writeback conflict, the instruction writeback slot component 425 resolves the conflict by computing a delay for the conflicting instruction based on unconflicted cycles from the register writeback scoreboard 430. Thus, if the cycle following the conflicted cycle is free, then the 2-cycle instruction can be given a 1-cycle writeback delay. If there is no conflict, then the instruction is given a 0-cycle writeback delay.

Once the register writeback delay is determined by the instruction writeback slot component 425, the instruction writeback slot component 425 writes the register writeback delay to the write delay component 445. An example implementation of the writeback delay component 445 can be a set of shift-registers, one register for each stage in the pipeline 450, or for a subset of stages in the pipeline 450 that could prompt a register writeback. As illustrated, the arrows leading from the pipeline 450 and the writeback delay component correspond, such that the topmost arrow of each corresponds to a writeback of stage two of the pipeline 450, the second topmost arrow to stage four, and the last arrow to stage six.

Upon each clock cycle, the shift registers of the writeback delay component 445 decrement the values stored therein. Thus, if the 2-cycle instruction had a three cycle delay, a numeric three is stored in the shift-register corresponding to the second stage of the pipeline 450. After the first cycle, the value in the register would be a two, then a one upon another cycle, and finally a zero upon the third cycle.

When the instructions are ready to writeback from the pipeline 450, the stage at which the writeback specifies which register in the writeback delay component 445 is consulted to determine whether the writeback will occur. For example, the 4-cycle instruction has a zero in the writeback delay component 445 when the fourth stage of the pipeline 450 completes, and so can writeback to the register file 435 immediately. However, the register in the writeback delay component 445 that corresponds to the 2-cycle instruction does not have a zero, and so the write back will not occur for this instruction. Rather, the thread for the 2-cycle instruction will be held at stage two of the pipeline 450. At the next cycle, the writeback delay component 445 register for stage two will decrement to zero and the writeback to the register file 435 of the 2-cycle instruction can proceed.

Instructions with later completion times (e.g., later pipeline stages) have priority over. Thus, on a given clock cycle, if an instruction at stage six and stage four are prepared to writeback to the register file 435, then the stage six instruction will perform the writeback. This ensures that the maximum writeback delay does not put the writeback beyond the pipeline length, which is the typical delay imposed upon other barrel-multithreaded processors. When the delay for an instruction is short than the pipeline length, then fewer clock cycles are wasted in a lightly loaded processor because shorter-cycle instructions can complete in fewer cycles than it takes to complete every stage in the pipeline 450.

Once the writeback to the register file 435 is complete, the thread can be rescheduled. This is accomplished by the pipelined thread ID component 440. The pipelined thread ID component 440 contains thread IDs of instructions moving through the pipeline 450. When an instruction is able to perform a writeback, the thread ID of that instruction is removed from the pipelined thread ID component 440 and delivered to the multiplexer 460 for reinsertion into the thread ready-to-run queue 405. In an example, the multiplexer selects an available thread ID from the pipelined thread ID component 440 before any other source (e.g., a memory response). Thus, the buffers 465 or 470 maintains the thread IDs from the variable-completion-time instructions until there is no input from the pipelined thread ID component 440.

Figure 5:
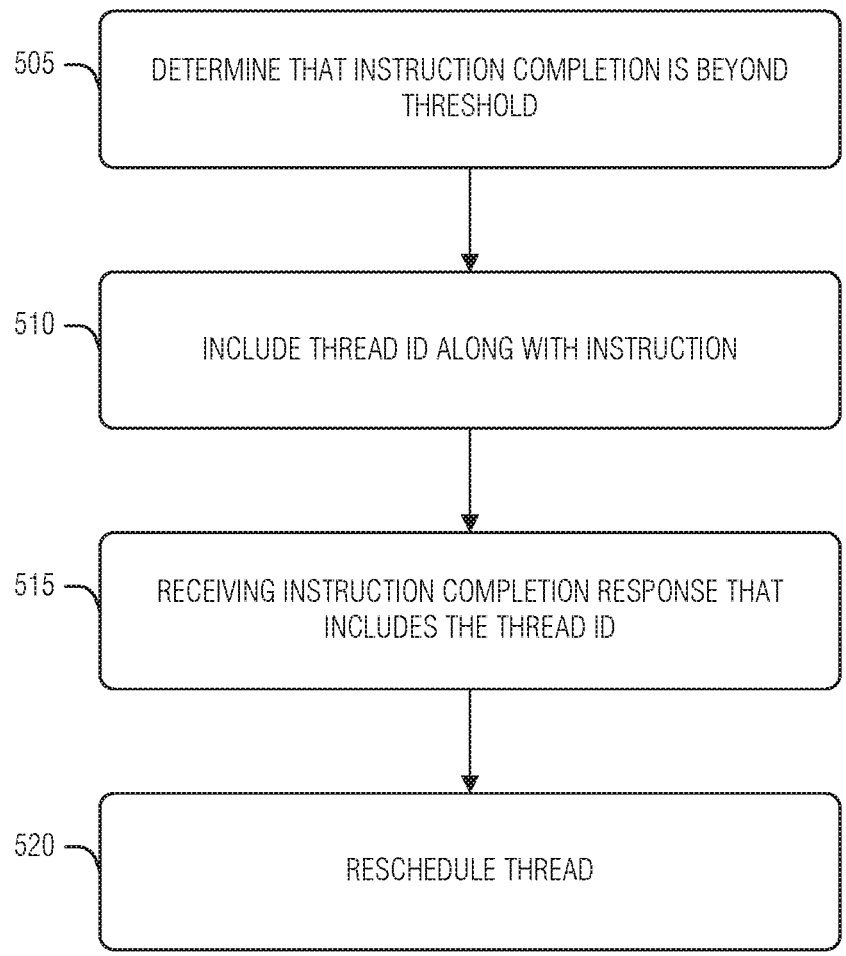
FIG. 5 is a flow chart of an example of a method for self-scheduling threads in a programmable atomic unit according to an embodiment.

FIG. 5 is a flow chart of an example of a method 500 for scheduling threads in a programmable atomic unit according to an embodiment. Operations of the method 500 are performed by computer hardware (e.g., processing circuitry).

In an example, the method is performed by a processor (e.g., the processor 305) in a PAU (e.g., PAU 300 or PAU 270) in a memory controller (e.g., memory controller 140 or memory controller 205). In an example, the memory controller is a chiplet (e.g., memory controller 140). In an example, the memory controller chiplet is integrated into a chiplet system (e.g., chiplet system 110).

At operation 505, a determination is made that an instruction will not complete within a threshold prior to insertion into a pipeline of the processor. In an example, the threshold is based on a number of pipeline stages in the processor.

In an example, determining that the instruction will not complete within the threshold includes determining that the instruction is for an external entity. In an example, the external entity is a memory. In an example, the external entity is a coprocessor.

At operation 510, a thread ID is passed along with to the instruction. Here, the thread ID corresponds to a thread of the instruction.

At operation 515, a response to completion of the instruction is received. This response includes the thread ID. In an example, receiving the response to the completion of the instruction includes buffering the thread ID until it is clear to reschedule the thread. In an example, it is clear to reschedule the thread when there are no pipeline threads ready to be rescheduled, a pipelined thread being a thread with an instruction that would complete with the threshold.

At operation 520, the thread is rescheduled in response to receiving the response with the thread ID. In an example, rescheduling the thread in response to receiving the response includes placing the thread ID from the response in a thread ready-to-run queue. In an example, rescheduling the thread includes scheduling a next thread by removing a thread ID from a head of the thread ready-to-run queue.

Figure 6:
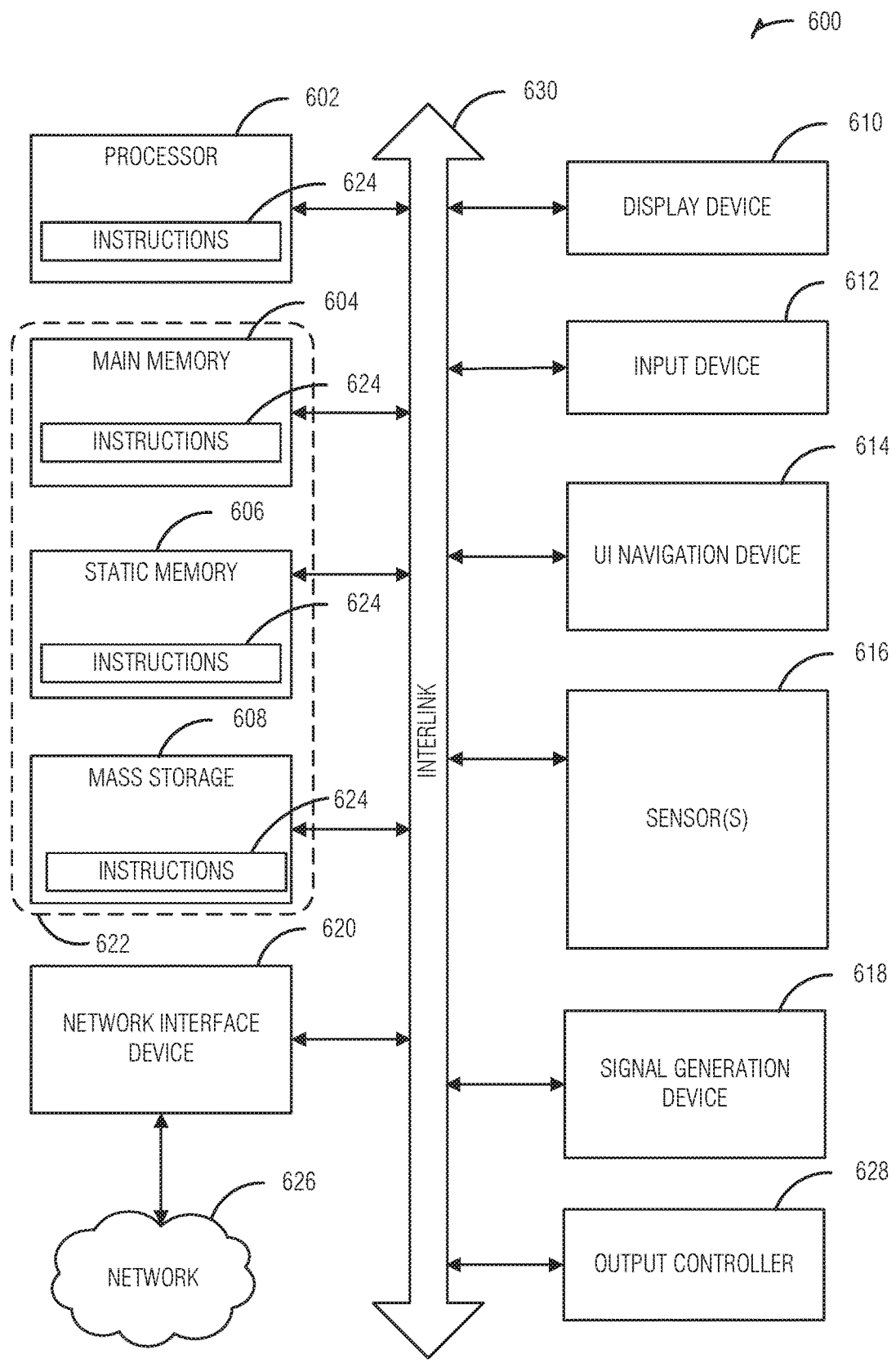
FIG. 6 is a block diagram of an example of a machine with which, in which, or by which embodiments of the present disclosure can operate.

FIG. 6 illustrates a block diagram of an example machine 600 with which, in which, or by which any one or more of the techniques (e.g., methodologies) discussed herein can be implemented. Examples, as described herein, can include, or can operate by, logic or a number of components, or mechanisms in the machine 600. Circuitry (e.g., processing circuitry) is a collection of circuits implemented in tangible entities of the machine 600 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 600 follow.

In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 600 can include a hardware processor 602 (e.g., a central processing unit (CPU), a graphics processing unit (GPU), a hardware processor core, or any combination thereof), a main memory 604, a static memory (e.g., memory or storage for firmware, microcode, a basic-input-output (BIOS), unified extensible firmware interface (UEFI), etc.) 606, and mass storage 608 (e.g., hard drives, tape drives, flash storage, or other block devices) some or all of which can communicate with each other via an interlink (e.g., bus) 630. The machine 600 can further include a display unit 610, an alphanumeric input device 612 (e.g., a keyboard), and a user interface (UI) navigation device 614 (e.g., a mouse). In an example, the display unit 610, input device 612 and UI navigation device 614 can be a touch screen display. The machine 600 can additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 602, the main memory 604, the static memory 606, or the mass storage 608 can be, or include, a machine readable medium 622 on which is stored one or more sets of data structures or instructions 624 (e.g., software) embodying or utilized by any one or more of the techniques or functions described herein. The instructions 624 can also reside, completely or at least partially, within any of registers of the processor 602, the main memory 604, the static memory 606, or the mass storage 608 during execution thereof by the machine 600. In an example, one or any combination of the hardware processor 602, the main memory 604, the static memory 606, or the mass storage 608 can constitute the machine readable media 622. While the machine readable medium 622 is illustrated as a single medium, the term "machine readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples can include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 622 can be representative of the instructions 624, such as instructions 624 themselves or a format from which the instructions 624 can be derived. This format from which the instructions 624 can be derived can include source code, encoded instructions (e.g., in compressed or encrypted form), packaged instructions (e.g., split into multiple packages), or the like. The information representative of the instructions 624 in the machine readable medium 622 can be processed by processing circuitry into the instructions to implement any of the operations discussed herein. For example, deriving the instructions 624 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 624.

In an example, the derivation of the instructions 624 can include assembly, compilation, or interpretation of the information (e.g., by the processing circuitry) to create the instructions 624 from some intermediate or preprocessed format provided by the machine readable medium 622. The information, when provided in multiple parts, can be combined, unpacked, and modified to create the instructions 624. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 624 can be further transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the communications network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. A transmission medium is a machine readable medium.

ADDITIONAL EXAMPLES

Example 1 is an apparatus comprising: circuitry configured to: determine that an instruction will not complete within a threshold prior to insertion into a pipeline of a processor that includes the apparatus, the pipeline comprising a sequence of hardware blocks to process portions of instructions; and passing a thread identifier (ID) with the instruction, the thread ID corresponding to a thread of the instruction; a first memory configured as a buffer to receive a response to completion of the instruction, the response including the thread ID; and a second memory configured as a queue to reschedule the thread in response to receiving the response with the thread ID.

In Example 2, the subject matter of Example 1, wherein the threshold is based on a number of pipeline stages in the processor.

In Example 3, the subject matter of any of Examples 1-2, wherein, to determine that the instruction will not complete within the threshold, the instruction writeback component is configured to determine that the instruction is for an external entity to the processor.

In Example 4, the subject matter of Example 3, wherein the external entity is a third memory.

In Example 5, the subject matter of any of Examples 3-4, wherein the external entity is a coprocessor.

In Example 6, the subject matter of any of Examples 1-5, wherein, to receive the response to the completion of the instruction, the buffer is configured to hold the thread ID until it is clear to reschedule the thread.

In Example 7, the subject matter of Example 6, wherein it is clear to reschedule the thread when there are no pipeline threads ready to be rescheduled, a pipelined thread being a thread with an instruction that would complete within the threshold.

In Example 8, the subject matter of any of Examples 1-7, wherein the queue is a thread ready-to-run queue.

In Example 9, the subject matter of Example 8, wherein, to reschedule the thread, the thread ready-to-run queue is configured to schedule a next thread by removing a thread ID from a head of the thread ready-to-run queue.

In Example 10, the subject matter of any of Examples 1-9, wherein the processor is a barrel-multithreaded processor.

In Example 11, the subject matter of any of Examples 1-10, wherein the processor is included in a programmable atomic unit in a memory controller.

In Example 12, the subject matter of Example 11, wherein the memory controller is a chiplet in a chiplet system.

Example 13 is a method comprising: determining that an instruction will not complete within a threshold prior to insertion into a pipeline of the processor; passing a thread identifier (ID) with the instruction, the thread ID corresponding to a thread of the instruction; receiving a response to completion of the instruction, the response including the thread ID; and rescheduling the thread in response to receiving the response with the thread ID.

In Example 14, the subject matter of Example 13, wherein the threshold is based on a number of pipeline stages in the processor.

In Example 15, the subject matter of any of Examples 13-14, wherein determining that the instruction will not complete within the threshold includes determining that the instruction is for an external entity.

In Example 16, the subject matter of Example 15, wherein the external entity is a memory.

In Example 17, the subject matter of any of Examples 15-16, wherein the external entity is a coprocessor.

In Example 18, the subject matter of any of Examples 13-17, wherein receiving the response to the completion of the instruction includes buffering the thread ID until it is clear to reschedule the thread.

In Example 19, the subject matter of Example 18, wherein it is clear to reschedule the thread when there are no pipeline threads ready to be rescheduled, a pipelined thread being a thread with an instruction that would complete within the threshold.

In Example 20, the subject matter of any of Examples 13-19, wherein rescheduling the thread in response to receiving the response includes placing the thread ID from the response in a thread ready-to-run queue.

In Example 21, the subject matter of Example 20, wherein rescheduling the thread includes scheduling a next thread by removing a thread ID from a head of the thread ready-to-run queue.

In Example 22, the subject matter of any of Examples 13-21, wherein the processor is a barrel-multithreaded processor.

In Example 23, the subject matter of any of Examples 13-22, wherein the processor is included in a programmable atomic unit in a memory controller.

In Example 24, the subject matter of Example 23, wherein the memory controller is a chiplet in a chiplet system.

Example 25 is a machine-readable medium including instructions that, when executed by a processor, cause the processor to perform operations comprising: determining that an instruction will not complete within a threshold prior to insertion into a pipeline of the processor; passing a thread identifier (ID) with the instruction, the thread ID corresponding to a thread of the instruction; receiving a response to completion of the instruction, the response including the thread ID; and rescheduling the thread in response to receiving the response with the thread ID.

In Example 26, the subject matter of Example 25, wherein the threshold is based on a number of pipeline stages in the processor.

In Example 27, the subject matter of any of Examples 25-26, wherein determining that the instruction will not complete within the threshold includes determining that the instruction is for an external entity.

In Example 28, the subject matter of Example 27, wherein the external entity is a memory.

In Example 29, the subject matter of any of Examples 27-28, wherein the external entity is a coprocessor.

In Example 30, the subject matter of any of Examples 25-29, wherein receiving the response to the completion of the instruction includes buffering the thread ID until it is clear to reschedule the thread.

In Example 31, the subject matter of Example 30, wherein it is clear to reschedule the thread when there are no pipeline threads ready to be rescheduled, a pipelined thread being a thread with an instruction that would complete within the threshold.

In Example 32, the subject matter of any of Examples 25-31, wherein rescheduling the thread in response to receiving the response includes placing the thread ID from the response in a thread ready-to-run queue.

In Example 33, the subject matter of Example 32, wherein rescheduling the thread includes scheduling a next thread by removing a thread ID from a head of the thread ready-to-run queue.

In Example 34, the subject matter of any of Examples 25-33, wherein the processor is a barrel-multithreaded processor.

In Example 35, the subject matter of any of Examples 25-34, wherein the processor is included in a programmable atomic unit in a memory controller.

In Example 36, the subject matter of Example 35, wherein the memory controller is a chiplet in a chiplet system.

Example 37 is a system comprising: means for determining that an instruction will not complete within a threshold prior to insertion into a pipeline of a processor; means for passing a thread identifier (ID) with the instruction, the thread ID corresponding to a thread of the instruction; means for receiving a response to completion of the instruction, the response including the thread ID; and means for rescheduling the thread in response to receiving the response with the thread ID.

In Example 38, the subject matter of Example 37, wherein the threshold is based on a number of pipeline stages in the processor.

In Example 39, the subject matter of any of Examples 37-38, wherein the means for determining that the instruction will not complete within the threshold include means for determining that the instruction is for an external entity.

In Example 40, the subject matter of Example 39, wherein the external entity is a memory.

In Example 41, the subject matter of any of Examples 39-40, wherein the external entity is a coprocessor.

In Example 42, the subject matter of any of Examples 37-41, wherein the means for receiving the response to the completion of the instruction include means for buffering the thread ID until it is clear to reschedule the thread.

In Example 43, the subject matter of Example 42, wherein it is clear to reschedule the thread when there are no pipeline threads ready to be rescheduled, a pipelined thread being a thread with an instruction that would complete within the threshold.

In Example 44, the subject matter of any of Examples 37-43, wherein the means for rescheduling the thread in response to receiving the response include means for placing the thread ID from the response in a thread ready-to-run queue.

In Example 45, the subject matter of Example 44, wherein the means for rescheduling the thread include means for scheduling a next thread by removing a thread ID from a head of the thread ready-to-run queue.

In Example 46, the subject matter of any of Examples 37-45, wherein the processor is a barrel-multithreaded processor.

In Example 47, the subject matter of any of Examples 37-46, wherein the processor is included in a programmable atomic unit in a memory controller.

In Example 48, the subject matter of Example 47, wherein the memory controller is a chiplet in a chiplet system.

Example 49 is at least one machine-readable medium including instructions that, when executed by processing circuitry, cause the processing circuitry to perform operations to implement of any of Examples 1-48.

Example 50 is an apparatus comprising means to implement of any of Examples 1-48.

Example 51 is a system to implement of any of Examples 1-48.

Example 52 is a method to implement of any of Examples 1-48.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus comprising:
   circuitry configured to:
      determine that an instruction will not complete within a threshold prior to insertion into a pipeline included in a processor, the processor including the apparatus, the pipeline comprising a sequence of hardware stages to process portions of instructions, wherein the processor is included in a memory controller, and wherein the processor is a programmable atomic unit or the memory controller is a chiplet in a chiplet system; and
      passing, to an entity external to the processor, a thread identifier (ID) with the instruction based on the determination that the instruction will not complete within the threshold, the thread ID corresponding to a thread of the instruction;
   a first memory configured as a buffer to receive a response to completion of the instruction by the entity external to the processor, the response including the thread ID; and
   a second memory configured as a queue of thread IDs to be dequeued by a scheduler of the processor to reschedule the thread in response to receiving the response with the thread ID, wherein to reschedule the thread includes scheduling another instruction of the thread.

2. The apparatus of claim 1, wherein the threshold is based on a number of pipeline stages in the processor.

3. The apparatus of claim 1, wherein, to receive the response to the completion of the instruction, the buffer is configured to hold the thread ID until it is clear to reschedule the thread.

4. The apparatus of claim 3, wherein it is clear to reschedule the thread when there are no pipeline threads ready to be rescheduled, a pipelined thread being a thread with an instruction that would complete within the threshold.

5. The apparatus of claim 1, wherein the queue is a thread ready-to-run queue.

6. The apparatus of claim 5, wherein, to reschedule the thread, the thread ready-to-run queue is configured to schedule a next thread by removing a thread ID from a head of the thread ready-to-run queue.

7. The apparatus of claim 1, wherein the entity external to the processor is a third memory or a coprocessor.

8. A method comprising:
   determining, by circuitry, that an instruction will not complete within a threshold prior to insertion into a pipeline included in a processor, the processor including the circuitry, wherein the processor is included in a memory controller, and wherein the processor is a programmable atomic unit or the memory controller is a chiplet in a chiplet system;
   passing, by the circuitry to an entity external to the processor, a thread identifier (ID) with the instruction based on the determination that the instruction will not complete within the threshold, the thread ID corresponding to a thread of the instruction;
   receiving, by the circuitry, a response to completion of the instruction by the entity external to the processor, the response including the thread ID; and rescheduling, by the circuitry, the thread based on receiving the response with the thread ID, wherein rescheduling the thread includes scheduling another instruction of the thread.

9. The method of claim 8, wherein the threshold is based on a number of pipeline stages in the processor.

10. The method of claim 8, wherein receiving the response to the completion of the instruction includes buffering the thread ID until it is clear to reschedule the thread.

11. The method of claim 10, wherein it is clear to reschedule the thread when there are no pipeline threads ready to be rescheduled, a pipelined thread being a thread with an instruction that would complete within the threshold.

12. The method of claim 8, wherein rescheduling the thread in response to receiving the response includes placing the thread ID from the response in a thread ready-to-run queue.

13. The method of claim 12, wherein rescheduling the thread includes scheduling a next thread by removing a thread ID from a head of the thread ready-to-run queue.

14. The method of claim 8, wherein the entity external to the processor is a memory or a coprocessor.

15. A non-transitory machine-readable medium including instructions that, when executed by a processor, cause the processor to perform operations comprising:
   determining that an instruction will not complete within a threshold prior to insertion into a pipeline included in the processor, wherein the processor is included in a memory controller, and wherein the processor is a programmable atomic unit or the memory controller is a chiplet in a chiplet system;
   passing, to an entity external to the processor, a thread identifier (ID) with the instruction based on the determination that the instruction will not complete within the threshold, the thread ID corresponding to a thread of the instruction;
   receiving a response to completion of the instruction by the entity external to the processor, the response including the thread ID; and
   rescheduling the thread based on receiving the response with the thread ID, wherein rescheduling the thread includes scheduling another instruction of the thread.

16. The non-transitory machine-readable medium of claim 15, wherein the threshold is based on a number of pipeline stages in the processor.

17. The non-transitory machine-readable medium of claim 15, wherein receiving the response to the completion of the instruction includes buffering the thread ID until it is clear to reschedule the thread.

18. The non-transitory machine-readable medium of claim 17, wherein it is clear to reschedule the thread when there are no pipeline threads ready to be rescheduled, a pipelined thread being a thread with an instruction that would complete within the threshold.

19. The non-transitory machine-readable medium of claim 15, wherein rescheduling the thread in response to receiving the response includes placing the thread ID from the response in a thread ready-to-run queue.

20. The non-transitory machine-readable medium of claim 19, wherein rescheduling the thread includes scheduling a next thread by removing a thread ID from a head of the thread ready-to-run queue.

21. The non-transitory machine-readable medium of claim 15, wherein the entity external to the processor is a memory or a coprocessor.

\* \* \* \* \*